United States Patent
Lai et al.

(10) Patent No.: US 9,123,887 B2
(45) Date of Patent: Sep. 1, 2015

(54) MAGNETIC ELECTRONIC DEVICE

(71) Applicant: National Tsing Hua University, Hsinchu (TW)

(72) Inventors: Chih-Huang Lai, Hsinchu (TW); Ding-Shuo Wang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/063,301

(22) Filed: Oct. 25, 2013

(65) Prior Publication Data

US 2014/0252515 A1    Sep. 11, 2014

(30) Foreign Application Priority Data

Mar. 7, 2013   (TW) .............................. 102108136 A

(51) Int. Cl.
*H01L 43/12* (2006.01)
*H01L 43/08* (2006.01)

(52) U.S. Cl.
CPC ................ *H01L 43/12* (2013.01); *H01L 43/08* (2013.01)

(58) Field of Classification Search
CPC ....... H01L 27/222; H01L 43/02; H01L 43/12; G11C 11/161
USPC ........................................... 257/421, E21.665
See application file for complete search history.

(56) References Cited

U.S. PATENT DOCUMENTS

| | | | |
|---|---|---|---|
| 8,125,814 B2 | 2/2012 | Tsai | |
| 2007/0190328 A1 | 8/2007 | Cowburn et al. | |
| 2011/0084347 A1 | 4/2011 | Shin et al. | |
| 2013/0001716 A1* | 1/2013 | Yamakawa et al. | 257/421 |
| 2014/0175581 A1* | 6/2014 | Guo | 257/421 |

FOREIGN PATENT DOCUMENTS

| | | |
|---|---|---|
| TW | 200802329 A | 1/2008 |
| TW | 201023353 A | 6/2010 |

* cited by examiner

*Primary Examiner* — Tucker Wright
(74) *Attorney, Agent, or Firm* — Muncy, Geissler, Olds & Lowe, P.C.

(57) ABSTRACT

A magnetic electronic device comprises a substrate, a buffer layer, a first CoFeB layer, a first metal oxidation layer and a capping layer. The buffer layer is disposed above the substrate. The first CoFeB layer is disposed above the buffer layer. The first metal oxidation layer is disposed above the first CoFeB layer. The capping layer is disposed above the first metal oxidation layer and covers the first metal oxidation layer. A manufacturing method of the magnetic electronic device is also disclosed.

7 Claims, 12 Drawing Sheets

MAGNETIC ELECTRONIC DEVICE

CROSS REFERENCE TO RELATED APPLICATIONS

This Non-provisional application claims priority under 35 U.S.C. §119(a) on Patent Application No(s). 102108136 filed in Taiwan, Republic of China on Mar. 7, 2013, the entire contents of which are hereby incorporated by reference.

BACKGROUND OF THE INVENTION

1. Field of Invention

The invention relates to a magnetic electronic device and a manufacturing method thereof and, in particular, to a magnetic electronic device and a manufacturing method thereof wherein the magnetic property of the free layer is adjusted.

2. Related Art

The concept of magnetic random access memory (MRAM) was brought up by Andreas Neyc with his colleagues of the Paul Drude institute in Germany. In MRAM, ferromagnetic metal is used and the data bit is stored by different relative magnetization alignment of the recording layer (free layer) and the reference layer (pinned layer), where parallel and anti-parallel magnetization alignment can result in low resistance level and high resistance level due to magnetoresistance (MR) effect, respectively. The data bit of a MRAM cell can be written by applying external magnetic field or current to reverse the magnetization direction of the recording layer. Different from static random access memory (SRAM) or dynamic random access memory (DRAM), MRAM is one kind of non-volatile memory since the stored data can be maintained until next external magnetic field or current is applied to reverse the magnetization direction. Both SRAM and DRAM are volatile since they need external periodic current supply all the time to retain the stored data, and therefore lots of unwanted heat would be generated and the power consumption is relatively large. Moreover, MRAM cell can be reset by ultra-short pulse field or current within only a few nanoseconds which is faster than the response speed of SRAM and DRAM. In short, MRAM possesses lots of advantages over SRAM and DRAM and is considered to be one of the most promising candidates for the next generation random access memory application.

In early days, MRAM cell is made by the effect of anisotropic magnetoresistance (AMR) to create different resistance levels, but the generated signal is too small to meet the practical requirements. MRAM didn't get vigorous development until the findings of giant magnetoresistance (GMR) and tunneling magnetoresistance (TMR) effects which can much enhance the signal level. Currently, the most commonly used materials of the magnetic tunneling junction (MTJ) is the structure of two CoFeB layers (i.e. ferromagnetic layer, both free layer and pinned layer) separated by one MgO layer (i.e. insulating layer) that are made by ultra-high vacuum sputtering method. After the as-grown amorphous CoFeB experiences an annealing treatment, a good texturing (001) can be generated at the interface of CoFeB and MgO, and such texturing results in considerable magnetoresistance. This related process of the structure is easier than epitaxial process and is more suitable for mass production, therefore becoming the mainstream in MRAM industry. MRAMs are usually made by magnetic materials with in-plane magnetic anisotropy nowadays. However, materials with perpendicular magnetic anisotropy are more usable than the in-plane devices since having higher recording density and theoretically smaller switching current density for spin-transfer torque, and thus becomes a focal topic for the researchers.

After H. Ohno's team from Tohoku University in Japan announced the magnetic tunneling junction of CoFeB/MgO with perpendicular magnetic anisotropy, such materials system has become the most promising candidate for MARM. In comparison with other competitors with perpendicular anisotropy such as cobalt-based multilayers or $L1_0$-ordered alloys, its better texturing (001) at the junction ensures extremely high magnetoresistance. However, usually the thickness of CoFeB cannot exceed 1.5 nm in order to maintain its perpendicular anisotropy. In all related literatures of CoFeB with perpendicular anisotropy, the unit-volume saturation magnetization of CoFeB has only reached 1000 emu/c.c., and the magnetic anisotropy energy thereof is still insufficient. The thermal stability factor, which is defined as the ratio of the magnetic energy to the thermal energy, is around 40 at most in all presenting works for CoFeB with perpendicular magnetic anisotropy, which is still below the required value of a stable recording media for 10-year-storage (>60) and therefore the applicability thereof is limited.

In practical MRAM manufacturing process, manufacturing a MTJ (magnetic tunnel junction) itself is a big challenge, but other problems will also be encountered in the integration of the front-end and back-end processes. The most important problem in those processes is the thermal budget of MTJs. Typical BEOL (back-end-of-line) process requires a high temperature forming gas annealing above 400° C., and usually the component would lose its perpendicular anisotropy after such high temperature treatment.

Therefore, it is an important subject to provide a magnetic electronic device and a manufacturing method thereof wherein the saturation magnetization and perpendicular anisotropy of the bilayer structure of CoFeB/oxide can be increased and the thermal stability and thermal endurance of the CoFeB layer (magnetic layer) can be enhanced a lot.

SUMMARY OF THE INVENTION

In view of the foregoing subject, an objective of the invention is to provide a magnetic electronic device and a manufacturing method thereof wherein the saturation magnetization and perpendicular anisotropy of the bilayer structure of CoFeB/oxide can be increased and the thermal stability of the CoFeB layer (magnetic layer) can be enhanced a lot.

To achieve the above objective, a magnetic electronic device according to the invention comprises a substrate, a buffer layer, a first CoFeB layer, a first metal oxidation layer and a capping layer. The buffer layer is disposed above the substrate. The first CoFeB layer is disposed above the buffer layer. The first metal oxidation layer is disposed above the first CoFeB layer. The capping layer is disposed above the first metal oxidation layer and covers the first metal oxidation layer.

To achieve the above objective, a manufacturing method of a magnetic electronic device according to the invention comprises steps of: providing a substrate; forming a buffer layer above the substrate; forming a first CoFeB layer above the buffer layer; forming a first metal oxidation layer above the first CoFeB layer, forming a capping layer above the first metal oxidation layer and covering the first metal oxidation layer; and implementing a rapid thermal annealing process.

In one embodiment, the material of the buffer layer includes platinum, palladium, tantalum or their any combination.

In one embodiment, the material of the capping layer includes magnesium, aluminum, titanium or their any combination.

In one embodiment, the thickness of the capping layer is between 1 nm and 6 nm.

In one embodiment, the magnetic electronic device experiences a rapid thermal annealing process.

In one embodiment, the temperature of the rapid thermal annealing process is between 330° C. and 600° C.

In one embodiment, the duration of the rapid thermal annealing process is 30 seconds.

As mentioned above, in the magnetic electronic device and manufacturing method thereof according to this invention, a capping layer is formed above the first metal oxidation layer and covers the first metal oxidation layer. Thereby, the capping layer of high reactivity can absorb the extra diffusing oxygen and boron atoms so that the magnetization and perpendicular anisotropy of the bilayer structure of CoFeB layer/oxide layer can be increased and the thermal stability of the CoFeB layer (magnetic layer) can be enhanced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
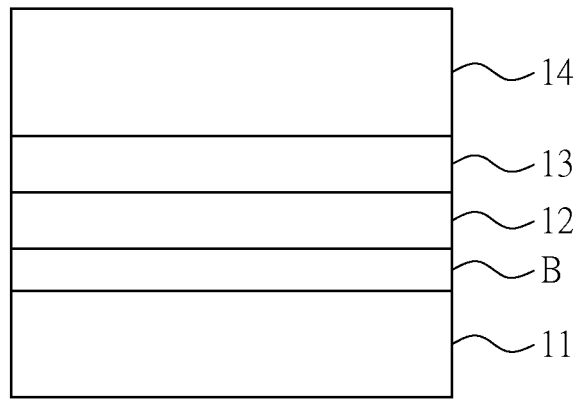
FIG. 1A is a schematic diagram of a magnetic electronic device according to a preferred embodiment of this invention.

FIG. 1A is a schematic diagram of a magnetic electronic device 1 according to a preferred embodiment of this invention.

As shown in FIG. 1A, the magnetic electronic device 1 includes a substrate 11, a buffer layer B, a first CoFeB layer 12, a first metal oxidation layer 13 and a capping layer 14.

Herein, the magnetic electronic device 1 can be applied to a memory or a magnetic field sensor. The said memory is magnetic random access memory (MRAM) or racetrack memory for example, and the said magnetic field sensor can be used in a geomagnetic sensing circuit for example.

The material of the substrate 11 can include silicon or silica, and herein $SiO_2$ is used as the substrate 11. Otherwise, the substrate 11 can be glass. The first CoFeB layer 12 is disposed above the substrate 11. In this embodiment, a buffer layer B is formed on the substrate 11, and then the first CoFeB layer 12 is formed on the buffer layer B, so that the buffer layer B is disposed between the first CoFeB layer 12 and the substrate 11. Herein, the material of the buffer layer B includes Pt, Pd or Ta, and the first CoFeB layer 12 is a magnetic layer (or called a free layer).

The first metal oxidation layer 13 is disposed above the first CoFeB layer 12. The first metal oxidation 13 has characteristics of superior insulation performance and no cavities so that it can prevent a short circuit between the first CoFeB layer 12 and the capping layer 14. Besides, the connecting surface of the first metal oxidation layer 13 has less roughness and excellent thermal stability. The material of the first metal oxidation layer 13 (or called a tunneling insulating layer) includes MgO or AlOx for example, and herein it is MgO as an embodiment.

Figure 1B:
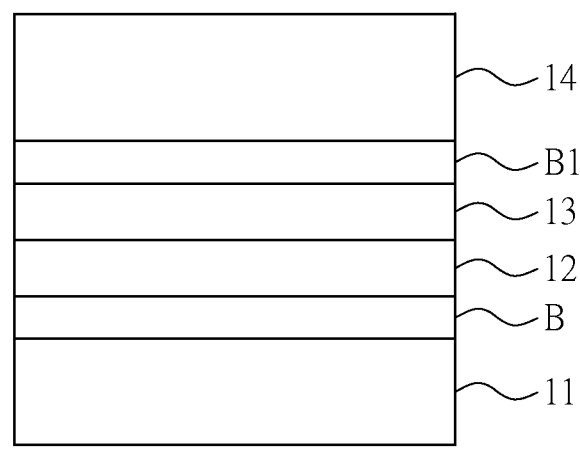
FIG. 1B is a schematic diagram of a variation of the magnetic electronic device according to a preferred embodiment of this invention.

The capping layer 14 is disposed above the first metal oxidation layer 13 and covers the first metal oxidation layer 13. In this embodiment, the capping layer 14 is directly disposed on the first metal oxidation layer 13, so as to contact and cover the upper surface of the first metal oxidation layer 13. In other embodiment as shown in FIG. 1B, a magnetic electronic device 1a has another buffer layer B1 disposed between the capping layer 14 and the first metal oxidation layer 13. The capping layer can include metal or alloy of high activity, and can be a single-layer or multilayer structure. The material of the capping layer 14 includes magnesium, aluminum, titanium or their any combination for example, and herein it is aluminum as an embodiment. Besides, the thickness of the capping layer 14 can be between 1 nm and 6 nm.

As shown in FIG. 1A, when the capping layer 14 is disposed above and covers the first metal oxidation layer 13, it needs to further experience a rapid thermal annealing (RTA) process. In detail, the magnetic electronic apparatus 1 (or 1a) having the capping layer 14 will be put under a vacuum environment and heated to the required annealing temperature, and then retains the temperature for a while, and finally cooled to the room temperature. Herein, the annealing temperature can be between 300° C. and 400° C. and is preferably 360° C. The temperature retaining time can be between 1 second and 5 minutes and is 5 minutes herein for example.

The formation of the first metal oxidation layer 13 should cause the magnetic property of the first CoFeB layer 12 to be impaired, but however in the rapid thermal annealing process, the extra oxygen atoms and boron atoms in the first CoFeB layer 12 will diffuse to the capping layer 14 through the first metal oxidation layer (MgO) 13, and the capping layer 14 of high activity will absorb the extra oxygen and boron atoms, so that the impaired magnetic property of the first CoFeB layer 12 is repaired. Thereby, the saturation magnetization, magnetic anisotropy and thermal stability of the first CoFeB layer (magnetic layer) 12 can be enhanced a lot. When the thickness of the capping layer 14 is larger, the higher magnetization and anisotropy can be obtained. In this embodiment, when the thickness of the capping layer (such as aluminum) 14 is 5 nm, the magnetic electronic device 1 (or 1a) can achieve the best saturation magnetization and perpendicular anisotropy after the rapid thermal annealing process. Herein, the saturation magnetization $M_S$ can reach 1500 emu/cc, and the anisotropy field $H_k$ can reach 4000 Oe.

Figure 2A:
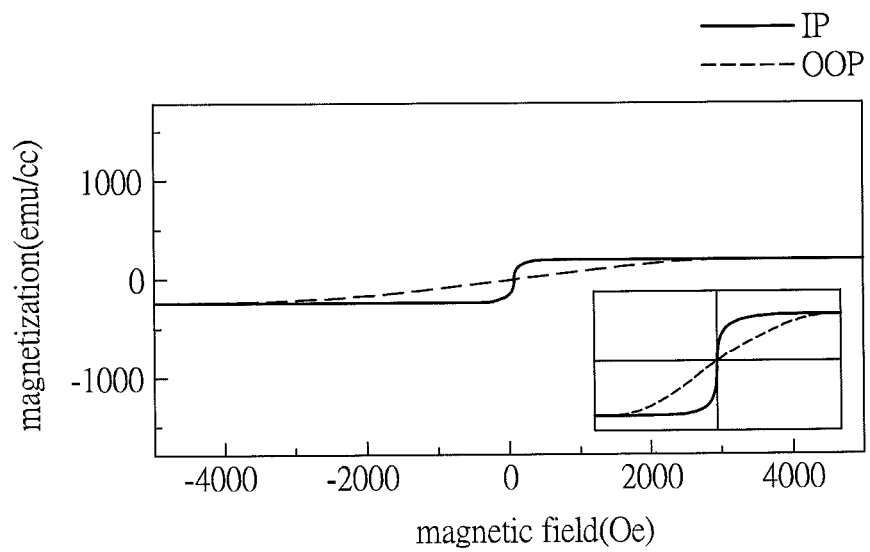
FIGS. 2A to 2C are graphs of in-plane (IP) and out-of-plane (OOP) hysteresis loops of the bilayer structure of the first CoFeB layer and first metal oxidation layer of the magnetic electronic device according to this invention.
Figure 2B:
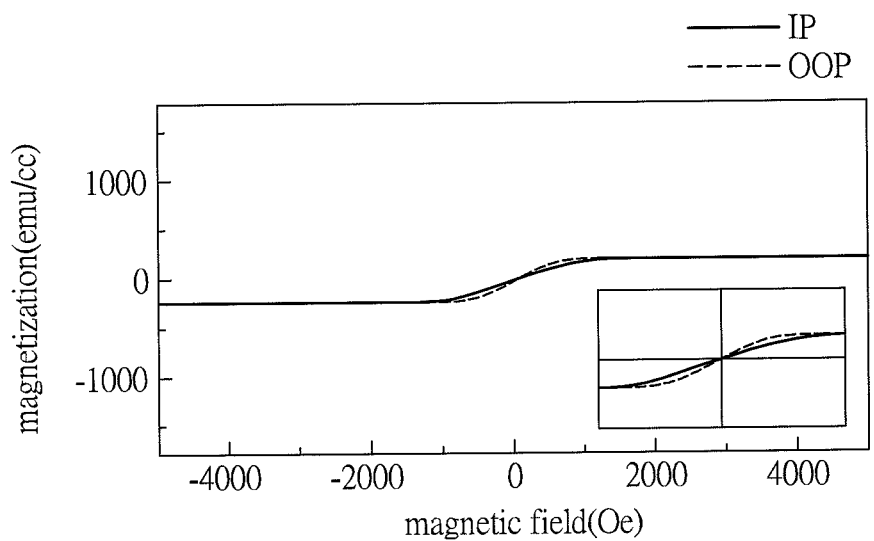
Figure 2C:
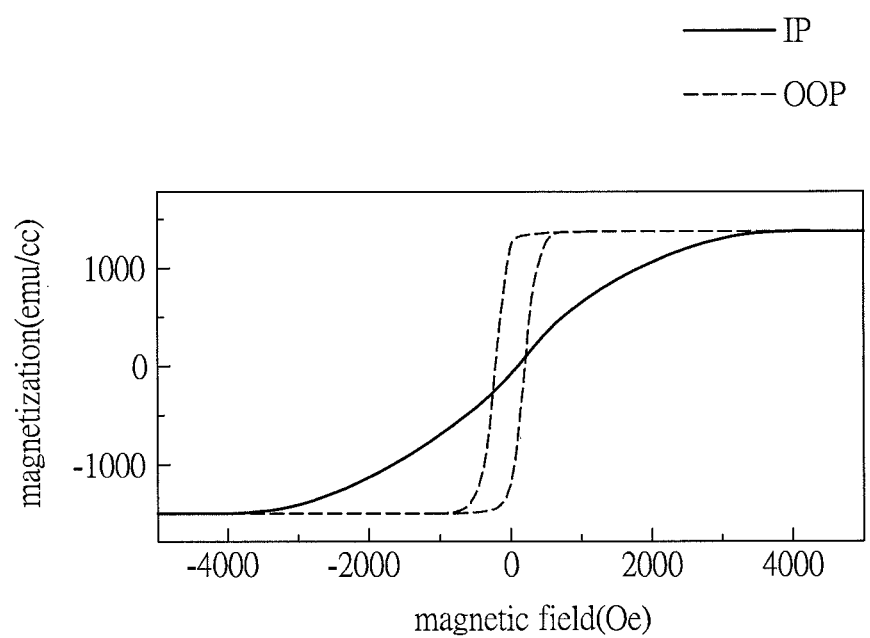

FIGS. 2A to 2C are graphs of in-plane (IP) and out-of-plane (OOP) hysteresis of the bilayer structure of the first CoFeB layer 12 and first metal oxidation layer 13 of the magnetic electronic device 1 (or 1a) according to this invention. FIG. 2A is a graph of the hysteresis in the case without the capping layer 14 and annealing process, FIG. 2B is a graph of the hysteresis in the case without the capping layer 14 but with the annealing process (360° C., 5 minutes), and FIG. 2C is a graph of the hysteresis in the case with the capping layer 14 (such as aluminum of 5 nm thickness) and annealing process (360° C., 5 minutes).

By comparing FIGS. 2A, 2B and 2C, it can be found that the magnetic electronic device with the capping layer 14 and annealing process in FIG. 2C has really high saturation magnetization. Besides, from the two hysteresis curves obtained according to the in-plane (IP) and out-of-plane (OOP) directions, it can be found that the perpendicular anisotropy in FIG. 2C is larger than the cases of FIGS. 2A and 2B.

Figure 2D:
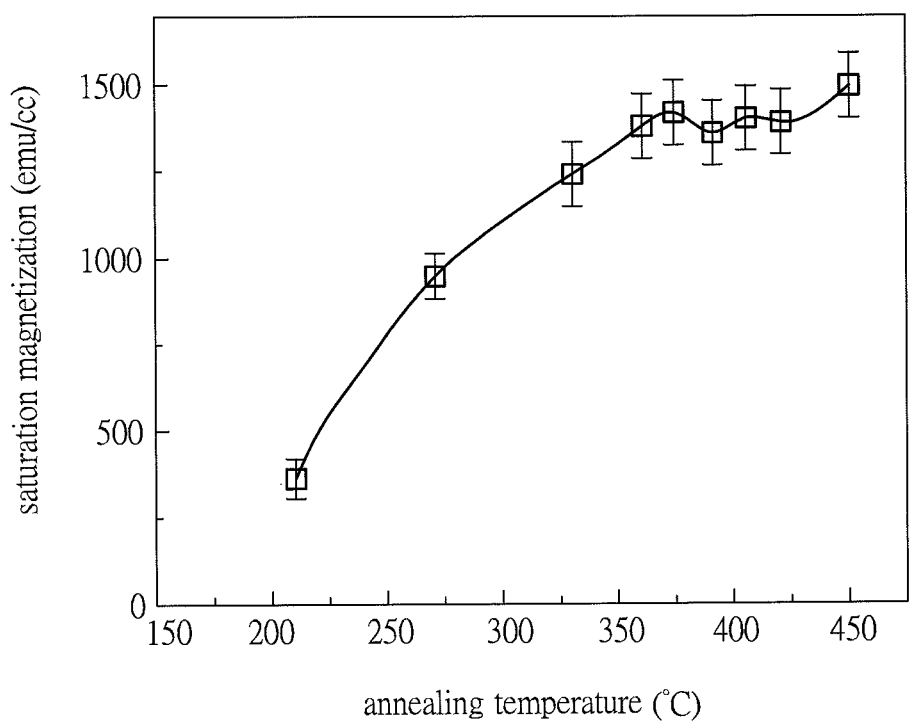
FIGS. 2D and 2E are graphs showing the saturation magnetization and perpendicular anisotropy field against different annealing temperatures after the magnetic electronic device is processed by the different annealing temperatures.
Figure 2E:
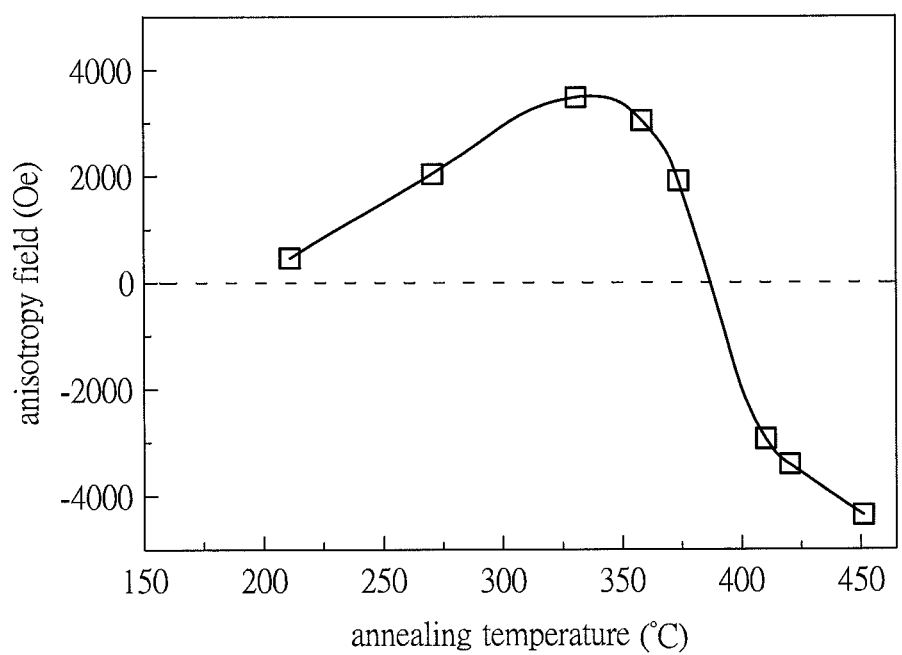

FIGS. 2D and 2E are graphs showing the saturation magnetization and perpendicular anisotropy field against different annealing temperatures after the magnetic electronic device 1 is processed by the different annealing temperatures.

As shown in FIG. 2D, when the annealing temperature is above 350° C., a larger saturation magnetization can be obtained. As shown in FIG. 2E, when the annealing temperature is above 360° C., the anisotropy field descends instead. Note that in FIG. 2E positive $H_k$ is used to denote in-plane saturation field of samples with perpendicular anisotropy and negative $H_k$ for out-of-plane saturation field of samples with in-plane anisotropy. Moreover, the direction of magnetic easy axis changes from OOP to IP immediately when the annealing temperature exceeds 400° C. Therefore, in this invention, the annealing temperature is set as 360° C. while the temperature retaining time is set as 5 minutes so that the magnetic electronic device 1 (or 1a) can reach the best saturation magnetization and perpendicular anisotropy field. Thereby, the saturation magnetization can reach 1500 eum/cc, and the perpendicular anisotropy field can reach 4000 Oe.

Figure 2F:
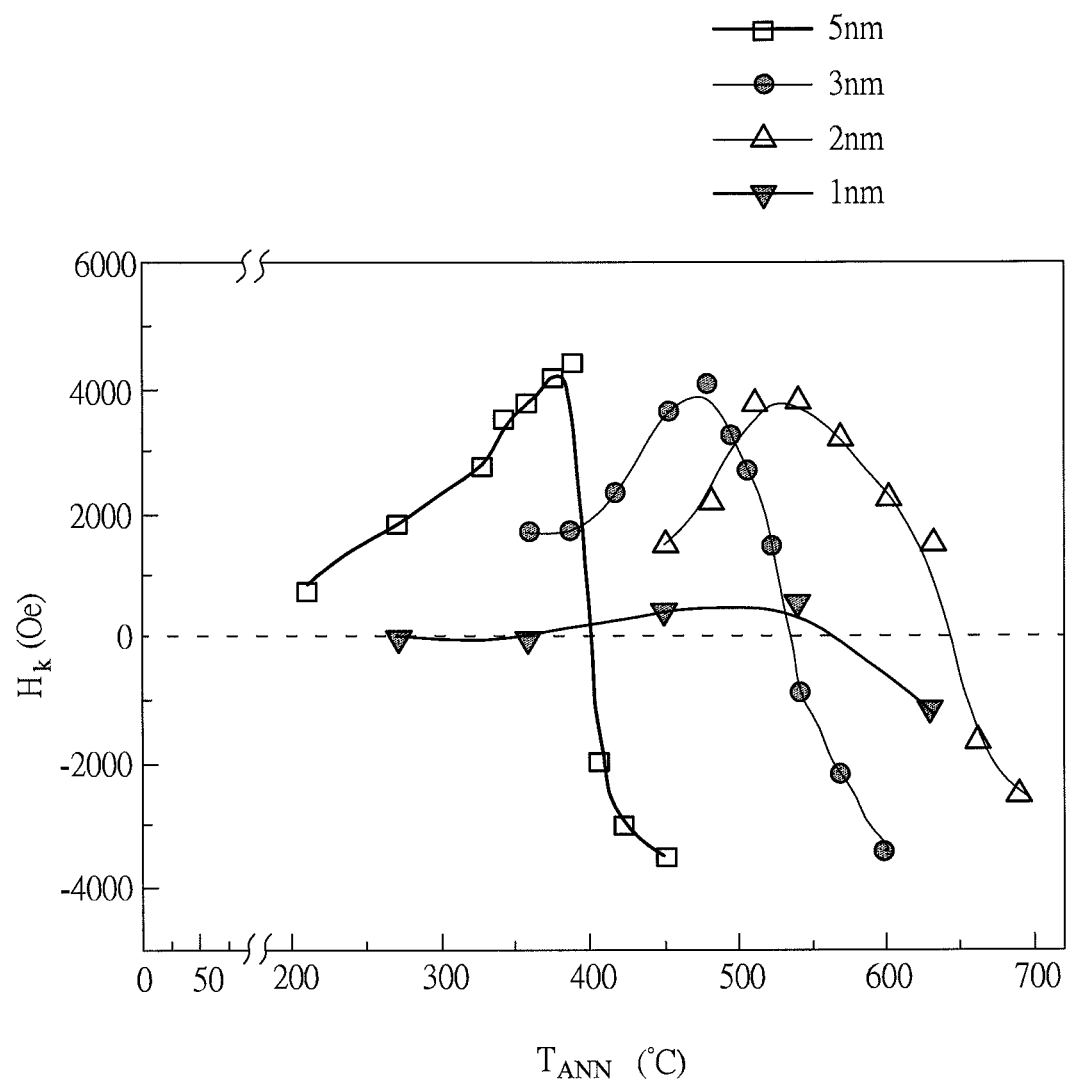
FIG. 2F is a schematic diagram showing the relation between the thermal endurance of the component and the thickness of the capping layer.

As shown in FIG. 2F, it is found that the thermal endurance of the component can be manipulated by adjusting the thickness of the capping layer. When the thickness of the capping layer is between 1.1 nm and 6.0 nm, the annealing temperature of the component can reach between 330° C. and 600° C. while the annealing duration here is 30 seconds as an example. The curve in the figure representing the anisotropy changing with annealing temperature moves rightward (higher temperature) with increasing capping layer thickness, which is because that the capping layer not only absorbs oxygen and boron atoms during annealing but also provides the driving force for the diffusion. The curvature of the curve and the transition temperature point can represent different driving force strength for diffusion. When the capping layer is thick (e.g. 5 nm), the sharp transition of anisotropy direction with temperature and the low transition temperature represents relatively higher diffusion rate of oxygen and boron. On the contrary, thinner capping layer (e.g. 2 nm) provides relatively weaker driving force for diffusion, therefore higher temperature is required to complete the diffusion. In other words, thinner capping layer can provide higher thermal endurance for maintaining perpendicular anisotropy in MTJs.

However, better thermal endurance is not an absolute superiority. It can be seen in FIG. 2F that the greatest perpendicular anisotropy obtained after the annealing is reduced with decreasing capping layer thickness. When the capping layer is ultrathin (e.g. 1nm), the perpendicular anisotropy cannot be built up since it is too thin to absorb all the oxygen and boron atoms. Accordingly, thermal endurance and greatest perpendicular anisotropy of the MTJ component can be optimized by choosing the right capping layer thickness and annealing temperature. It can be seen in FIG. 2F that the annealing temperature for establishing perpendicular anisotropy is between 200° C. and 400° C. when the thickness of the capping layer is 5 nm; between 350° C. and 525° C. when the thickness of the capping layer is 3 nm; between 450° C. and 650° C. when the thickness of the capping layer is 2 nm.

Figure 3A:
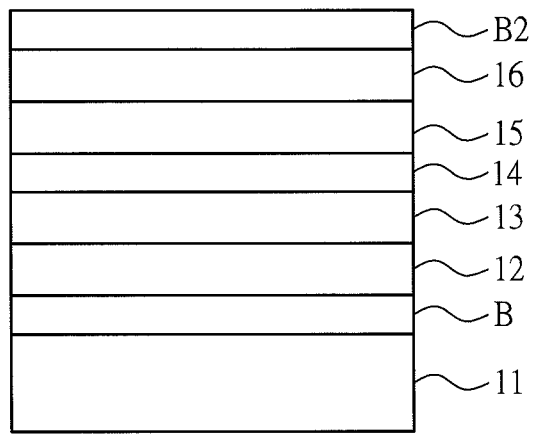
FIGS. 3A to 3C are schematic diagrams of the magnetic electronic devices according to different embodiments of this invention.
Figure 3B:
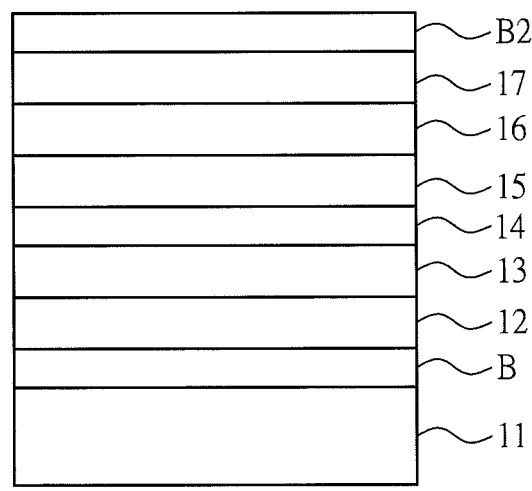
Figure 3C:
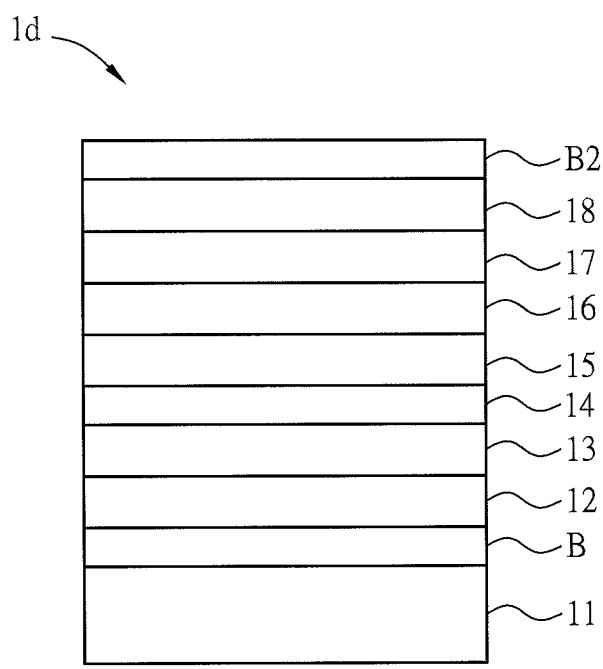

FIGS. 3A to 3C are schematic diagrams of the magnetic electronic devices 1b to 1d according to different embodiments of this invention. The magnetic electronic devices 1b to 1d can be applied to the MRAM.

As shown in FIG. 3A, mainly different from the magnetic electronic device 1, the magnetic electronic device 1b further includes a second metal oxidation layer 15, a second CoFeB layer 16 and a buffer layer B2. The second metal oxidation (such as magnesium oxide) 15 is disposed above the capping layer 14, the second CoFeB layer 16 is disposed above the second metal oxidation layer 15, and the buffer layer (such as Pd) B2 is disposed on the second CoFeB layer 16, so that the second CoFeB layer 16 is disposed between the second metal oxidation layer 15 and the buffer layer B2. The different thickness of the second CoFeB layer 16 can result in different coercivity of the magnetic electronic device 1b. Other technical features of the magnetic electronic device 1b can be known by referring to the magnetic electronic device 1, and therefore they are not described here for conciseness. To be noted, the magnetic electronic device 1b is also called a pseudo spin-valve structure.

As shown in FIG. 3B, mainly different from the magnetic electronic device 1b, the magnetic electronic device 1c further includes a ferromagnetic layer 17 disposed above the second CoFeB layer 16, so that the ferromagnetic layer 17 is disposed between the second CoFeB layer 16 and the buffer layer B2. The ferromagnetic layer 17 can be a single-layer or multilayer structure, and can include cobalt, iron, nickel, platinum or their combination. However, the invention is not limited thereto. Similarly, the second CoFeB layer 16 and the ferromagnetic layer 17 also can result in different coercivity of the magnetic electronic device 1c. Other technical features of the magnetic electronic device 1c can be known by referring to the magnetic electronic device 1b, and therefore they are not described here for conciseness.

As shown in FIG. 3C, mainly from the magnetic electronic device 1c, the magnetic electronic device 1d further includes an antiferromagnetic layer 18 disposed above the ferromagnetic layer 17, so that the anti-ferromagnetic layer 18 is disposed between the ferromagnetic layer 17 and the buffer layer B2. Herein, the antiferromagnetic layer 18 can include IrMn or PtMn, but the invention is not limited thereto. The interface of the ferromagnetic layer 17 and the antiferromagnetic layer 18 can generate the exchange coupling effect, which can create an unidirectional anisotropy energy. Besides, the second CoFeB layer 16, the ferromagnetic layer 17 and the antiferromagnetic layer 18 can enhance the thermal stability of the magnetic electronic device 1d. Other technical features of the magnetic electronic device 1d can be known by referring to the magnetic electronic device 1c, and therefore they are not described here for conciseness.

Figure 4:
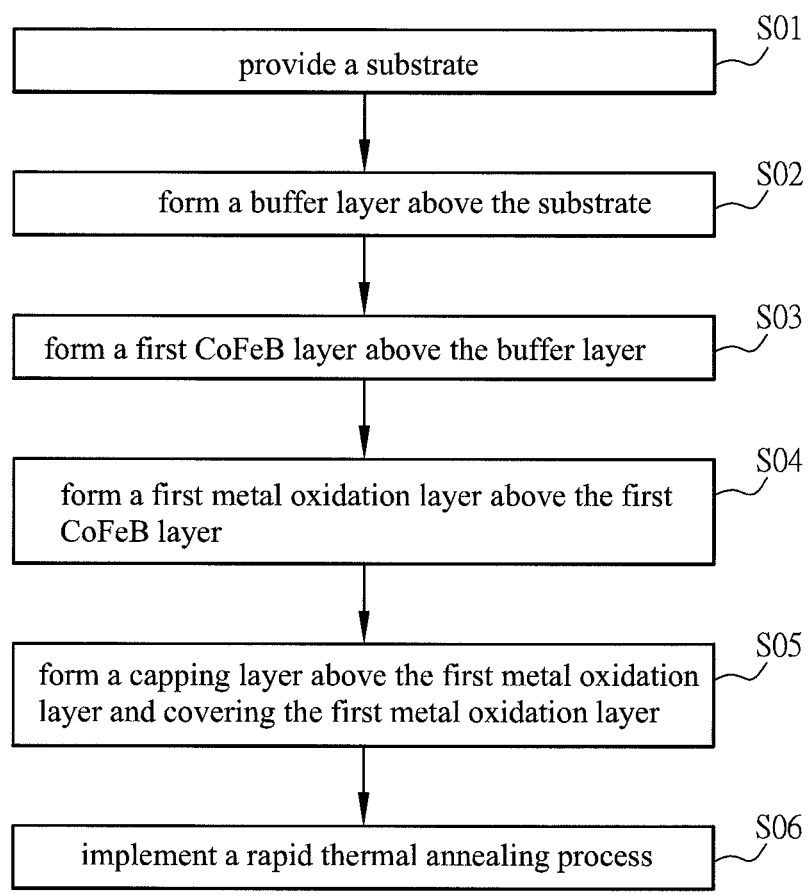
FIG. 4 is a flow chart of a manufacturing method of a magnetic electronic device according to a preferred embodiment of the invention.

FIG. 4 is a flow chart of a manufacturing method of a magnetic electronic device according to a preferred embodiment of the invention, and FIGS. 5A to 5D are schematic diagrams of the manufacturing method of the magnetic electronic device according to the invention.

The manufacturing method of the magnetic electronic device includes the steps S01 to S06.

Figure 5A:
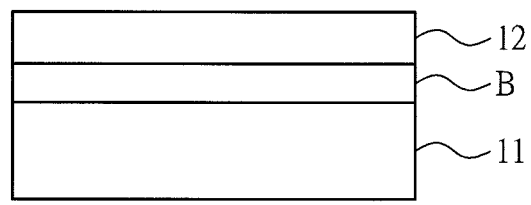
FIGS. 5A to 5D are schematic diagrams of the manufacturing method of the magnetic electronic device according to the invention.

First, as shown in FIG. 5A, the step S01 is to provide a substrate 11, the step S02 is to form a buffer layer B above the substrate 11, and then the step S03 is to form a first CoFeB layer 12 above the buffer layer B, so that the buffer layer B is disposed between the first CoFeB layer 12 and the substrate 11.

Figure 5B:
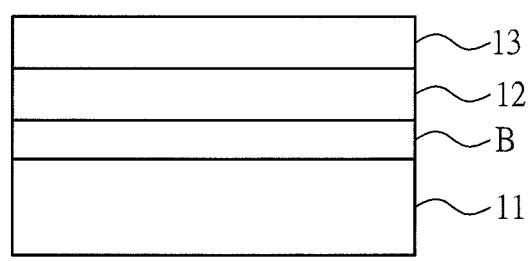

Subsequently, as shown in FIG. 5B, the step S04 is to form a first metal oxidation layer 13 above the first CoFeB layer 12. Herein, the material of the first metal oxidation layer 13 is MgO for example. As an embodiment, a magnesium thin film can be formed on the first CoFeB layer 12 and then oxidized by an oxygen plasma treatment to make the first metal oxidation layer 13. Otherwise, implementing the radio-frequency plasma bombardment with a ceramic MgO target also can make the first metal oxidation layer 13.

Figure 5C:
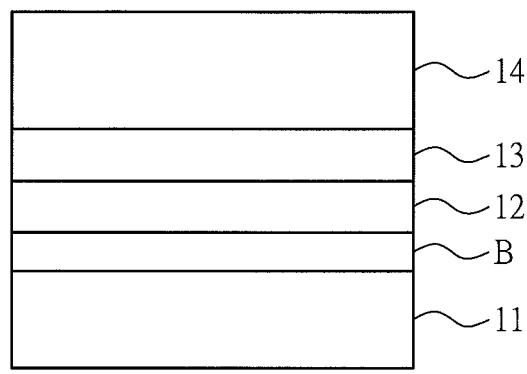

Then, as shown in FIG. 5C, the step S05 is to form a capping layer 14 above the first metal oxidation layer 13 and covering the first metal oxidation layer 13. Herein, the capping layer 14 is directly formed on the first metal oxidation layer 13, so as to contact and cover the upper surface of the first metal oxidation layer 13. The material of the capping layer 14 includes magnesium, aluminum, titanium or their any combination, and the thickness of the capping layer 14 is between 1 nm and 6 nm, for example. Herein, the capping layer 14 is aluminum with 5 nm thickness for example.

Figure 5D:
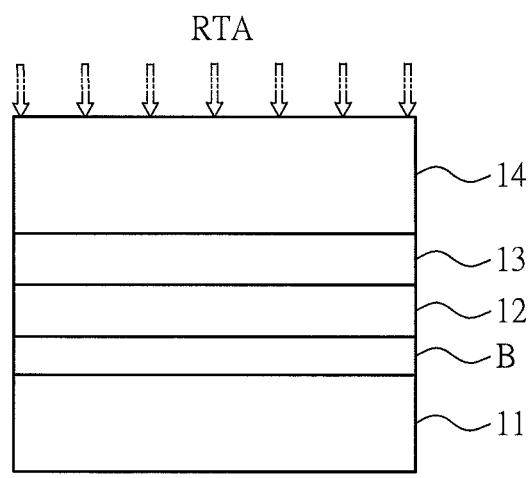

As shown in FIG. 5D, the step S06 is to implement a rapid thermal annealing process to complete the magnetic electronic device 1. The temperature of the rapid thermal annealing process can be between 300° C. and 400° C., and the temperature retaining time can be between 1 second and 30 minutes, for example. Herein, the temperature is 360° C. and the temperature retaining time is 5 minutes, for example.

Figure 6:
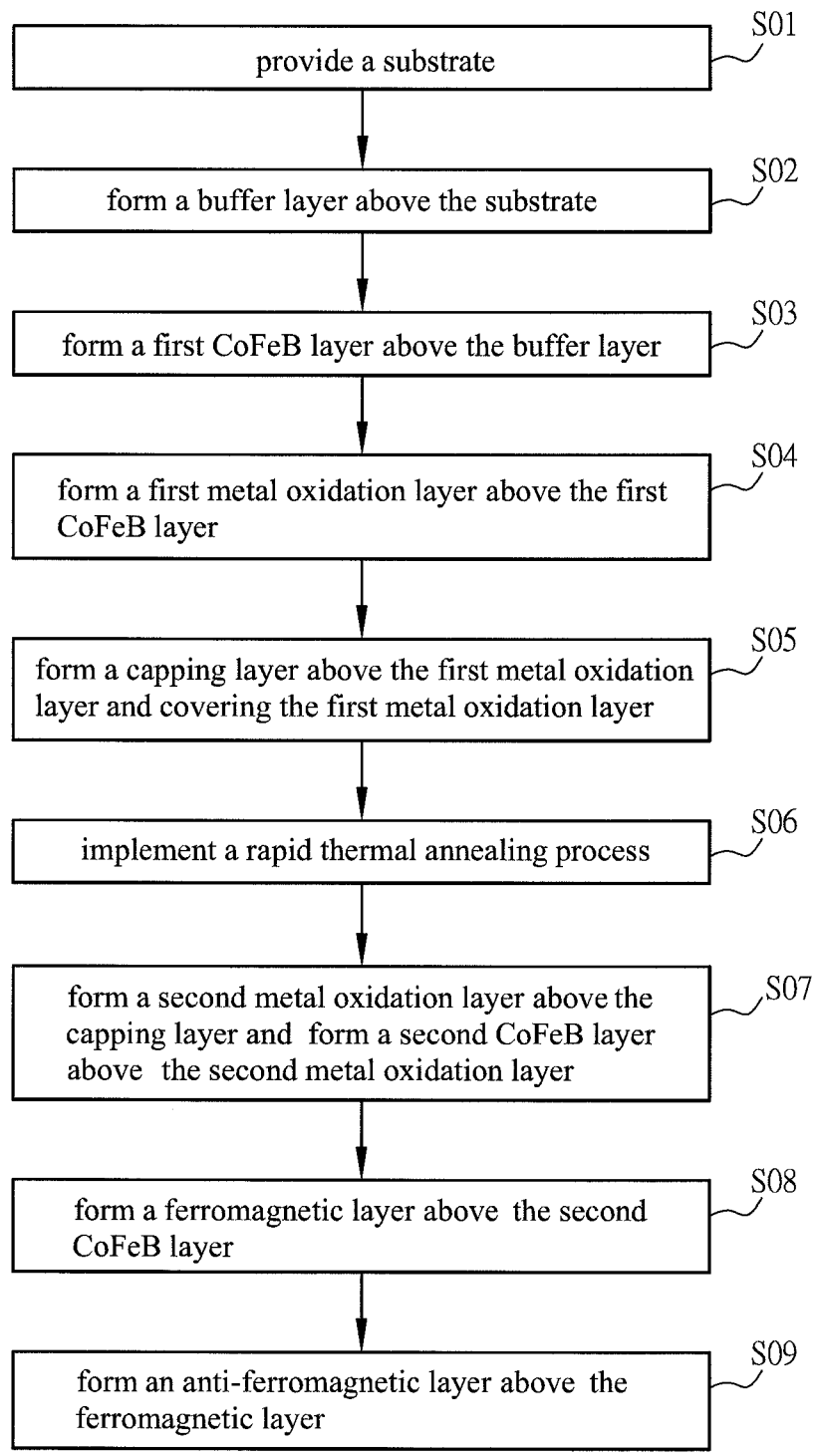
FIG. 6 is a flow chart of another manufacturing method of the magnetic electronic device according to the invention.

FIG. 6 is a flow chart of another manufacturing method of the magnetic electronic device according to the invention.

As shown in FIG. 6, the manufacturing method can further include a step S07. As shown in FIG. 3A, the step S07 is to form a second metal oxidation layer 15 above the capping layer 14 and to form a second CoFeB layer 16 above the second metal oxidation layer 15. Then, a buffer layer (such as palladium) B2 is formed above the second CoFeB layer 16, so that the second CoFeB layer 16 is disposed between the second metal oxidation layer 15 and the buffer layer B2, for completing the magnetic electronic device 1b.

Then, as shown in FIG. 3B, the manufacturing method can further include a step S08 which is to form a ferromagnetic layer 17 above the second CoFeB layer 16. Herein, the ferromagnetic layer 17 is formed above the second CoFeB layer 16, so that the ferromagnetic layer 17 is disposed between the second CoFeB layer 16 and a buffer layer B2, for completing the magnetic electronic device 1c. The ferromagnetic layer 17 can be a single-layer or multilayer structure, and can include cobalt, iron, nickel, platinum or their combination.

Lastly, as shown in FIG. 3C, the manufacturing method can further include a step S09 which is to form an antiferromagnetic layer 18 above the ferromagnetic layer 17. Herein, the antiferromagnetic layer 18 is formed above the ferromagnetic layer 17, so that the antiferromagnetic layer 18 is disposed between the ferromagnetic layer 17 and a buffer layer B2, for completing the magnetic electronic device 1d. The antiferromagnetic layer 18 can include IrMn or PtMn, but this invention is not limited thereto.

Other technical features of the manufacturing method of the magnetic electronic device of the invention can be known by referring to the foregoing illustration, and therefore they are not described here for conciseness.

In summary, in the magnetic electronic device and manufacturing method thereof according to this invention, a capping layer is formed above the first metal oxidation layer and covers the first metal oxidation layer. Thereby, the capping layer of high activity can absorb the extra diffusing oxygen and boron atoms so that the magnetization and perpendicular anisotropy of the bilayer structure of CoFeB layer/oxide layer can be increased and the thermal stability of the CoFeB layer (magnetic layer) can be enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A magnetic electronic device, comprising:
   a substrate;
   a buffer layer disposed above the substrate;
   a first CoFeB layer disposed above the buffer layer;
   a first metal oxidation layer disposed above the first CoFeB layer; and
   a capping layer directly disposed on an upper surface of the first metal oxidation layer, wherein the capping layer contacts and covers the upper surface of the first metal oxidation layer.

2. The magnetic electronic device as recited in claim 1, wherein the material of the buffer layer includes platinum, palladium, tantalum or their any combination.

3. The magnetic electronic device as recited in claim 1, wherein the material of the capping layer includes magnesium, aluminum, titanium or their any combination.

4. The magnetic electronic device as recited in claim 1, wherein the thickness of the capping layer is between 1.1 nm and 6.0 nm.

5. The magnetic electronic device as recited in claim 4, which experiences a rapid thermal annealing process.

6. The magnetic electronic device as recited in claim 5, wherein the temperature of the rapid thermal annealing process is between 330° C. and 600° C. and the duration of the thermal annealing process is 30 seconds.

7. The magnetic electronic device as recited in claim 5, wherein the duration of the rapid thermal annealing process is 30 seconds.

* * * * *